United States Patent
Ma et al.

(10) Patent No.: US 6,808,954 B2
(45) Date of Patent: Oct. 26, 2004

(54) VACUUM-CAVITY MEMS RESONATOR

(75) Inventors: Qing Ma, San Jose, CA (US); Peng Cheng, Campbell, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 09/949,368

(22) Filed: Sep. 7, 2001

(65) Prior Publication Data

US 2003/0048520 A1 Mar. 13, 2003

(51) Int. Cl.[7] ................................................. H01L 21/00
(52) U.S. Cl. ........................... 438/51; 438/52; 359/295
(58) Field of Search ................................. 359/295, 291; 333/186; 438/48, 51, 52

(56) References Cited

U.S. PATENT DOCUMENTS 5,589,082 A * 12/1996 Lin et al. ...................... 216/2
6,174,820 B1 * 1/2001 Habermehl et al. ......... 438/745
6,635,509 B1 * 10/2003 Ouellet ....................... 438/106

* cited by examiner

Primary Examiner—Alexander Ghyka
(74) Attorney, Agent, or Firm—Schwegman, Lundberg, Woessner & Kluth, P.A.

(57) ABSTRACT

A microelectromechanical (MEMS) resonator with a vacuum-cavity is fabricated using polysilicon-enabled release methods. A vacuum-cavity surrounding the MEMS beam is formed by removing release material that surrounds the beam and sealing the resulting cavity under vacuum by depositing a layer of nitride over the structure. The vacuum-cavity MEMS resonators have cantilever beams, bridge beams or breathing-bar beams.

25 Claims, 11 Drawing Sheets

VACUUM-CAVITY MEMS RESONATOR

FIELD OF THE INVENTION

The present invention relates to microelectromechanical systems (MEMS), and in particular to vacuum cavity packaging of MEMS resonators.

BACKGROUND OF THE INVENTION

A resonator is an electronic device used for setting up and maintaining an oscillating electrical signal of a given frequency. Conventional resonators typically include electronic circuitry in combination with a mechanical oscillator element (e.g., a quartz crystal, a ceramic element or a resonance circuit). Resonators are used in many electronic devices, such wireless radio frequency (RF) equipment, for generating outgoing signals of a particular frequency, and filtering incoming signals.

In most electronic devices that require signal generation and filtering, conventional resonators are used. Such resonators have a high Q-factor (i.e., a sharp resonance peak) good frequency stability and are generally very reliable. However, conventional resonators tend to be relatively large (i.e., on the order of 1 cm), so that alternatives are preferred when trying to fabricate a compact electronic device.

One alternative to conventional crystal-based resonators is a microelectromechanical systems (MEMS) resonator. Generally, a MEMS device is a microdevice that integrates mechanical and electrical elements on a common substrate using microfabrication technology. The electrical elements are typically formed using known integrated circuit fabrication technology. The mechanical elements are typically fabricated using lithographic and other related processes to perform micromachining, wherein portions of a substrate (e.g., silicon wafer) are selectively etched away or added to with new materials and structural layers.

FIG. 1 shows one type of prior art MEMS resonator 10 formed on a substrate 12. MEMS resonator 10 has a cantilever-type beam 16 arranged between a lower electrode 20 and an upper electrode 26. Beam 16 is electrostatically driven by the upper and lower electrodes to oscillate at a given frequency. FIG. 2 shows another type of prior art MEMS resonator 40 similar to MEMS resonator 10 but having a bridge-type beam 46 and an optional bridge-type upper electrode 50. Beam 46 is anchored to the substrate at its ends so that the center portion of the beam can be driven to oscillate by being electrostatically deflected between the upper and lower electrodes. FIG. 3 shows yet another prior art MEMS resonator 70 called a "breathing bar resonator." MEMS resonator 70 includes a bar-type beam 76 fixed to substrate 12 with a single central support member 80. Side electrodes 84 and 86 are located on either side of beam 76 with small gaps 88 in between. Electrodes 84 and 86 drive beam 76 to expand and contract (i.e., resonate) along its long axis in a manner that resembles breathing.

MEMS resonators are desirable for many miniaturized electronic devices because they can be made smaller than conventional resonators by an order of magnitude or more. However, because a MEMS resonator relies on the mechanical oscillation of a very small (i.e., micron-sized) beam as opposed to the vibration of a relatively large oscillation element (e.g., a centimeter-size crystal), the resonator must be packaged in a vacuum to eliminate air damping of the beam's oscillation. Vacuum packaging is also necessary to avoid the adsorption of contaminants, which can alter the resonant frequency of the beam.

A challenge in fabricating MEMS resonators is the vacuum packaging step. Various techniques for vacuum packaging a MEMS resonator are available, such as wafer bonding, flip-chip, and thick membrane transfer techniques. However, these techniques require dedicated alignment/bonding technologies that are relatively complicated to apply to MEMS packaging. Another technique for MEMS vacuum packaging involves using a permeable polysilicon release process. While conceptually simple, such a process has proven very difficult to control and has yet to lead to a manufacturable MEMS resonator vacuum packaging process.

BRIEF DESCRIPTION OF THE DRAWINGS

In the Figures, like reference numbers refer to like elements.

DETAILED DESCRIPTION OF THE INVENTION

The present invention provides vacuum cavities for MEMS resonators by a film deposition and release process that does not add a significant number of additional steps to the MEMS resonator fabrication process.

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Cantilever-beam MEMS resonator (FIGS. 4A–4K)

Figure 4A:
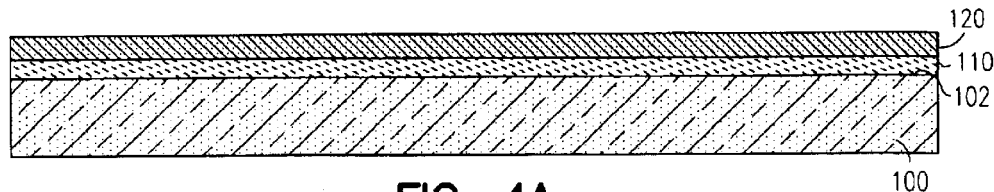
FIGS. 4A, 4B, 4C, 4D, 4E, 4F, 4G, 4H, 4I, 4J, and 4K illustrate the various structures associated with a method of forming a vacuum-cavity MEMS resonator with a cantilever beam.

In FIG. 4A, the method begins by providing a substrate 100 having an upper surface 102. In an example embodiment, substrate 100 is a standard semiconductor wafer. A nitride layer 110 (e.g., silicon nitride) is formed upper surface 102 of substrate 100. In an example embodiment, nitride layer 110 has a thickness ranging anywhere from about 1000 Anstroms to 5000 Angstroms. Nitride layer 110 serves as a passivation layer upon which the MEMS resonator of the present invention is formed. Atop nitride layer 110 is formed a polysilicon layer 120, which in an example embodiment may have a thickness of up to one micron or so.

Figure 4B:
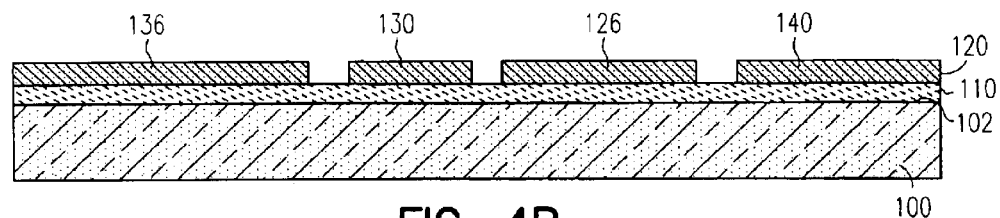

In FIG. 4B, polysilicon layer 120 is selectively etched to form a lower electrode 126, a beam base 130, and upper electrode contacts 136 and 140. In an example embodiment, electrode contacts 136 and 140 and lower electrode 126 are connected to bond pads (not shown), which in turn are connected to a programmable voltage source (not shown) for providing power to the device. Also, beam base 130 may be connected to ground.

The selective etching of layer 120 may be performed, in an example embodiment, by using standard lithography techniques, i.e., coating layer 120 with a layer of photoresist (not shown), exposing the photoresist layer with a pattern using photolithographic imaging of a patterned mask (not shown), etching the structure (e.g., with a reactive-ion etch) to form the pattern in the layer, and then removing the remaining photoresist.

Figure 1:
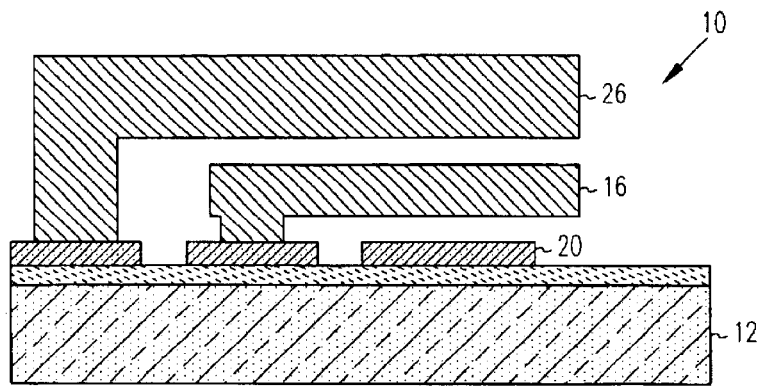
FIG. 1 is a schematic cross-sectional diagram of a prior art MEMS resonator with a cantilever beam surrounded by two actuation electrodes.
Figure 4C:
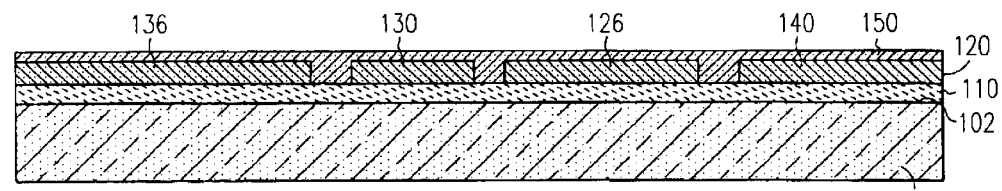

In FIG. 4C, a release layer 150 is formed atop lower electrode 126, electrode contacts 136 and 140, and the exposed (i.e., uncovered) portions of nitride layer 110. Release layer 150 may be, for example, an oxide such as silicon dioxide, or a polymer such as polyimide or photoresist. Release layer 150 is formed to a predetermined thickness (typically, a few hundred to a few thousand Angstroms) to set the spacing between lower electrode 126 and the yet-to-be-formed beam (FIG. 1). To ensure release layer 150 has the proper thickness, chemical-mechanical polishing (CMP) of the layer may optionally be performed.

Figure 4D:
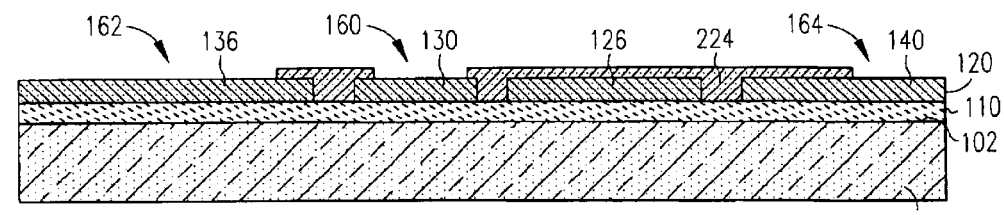

In FIG. 4D, release layer 150 is selectively processed (e.g., using standard lithography techniques) to define an opening 160 that extends down to beam base 130, and to define openings 162 and 164 that extend down to upper electrode contacts 136 and 140.

Figure 4E:
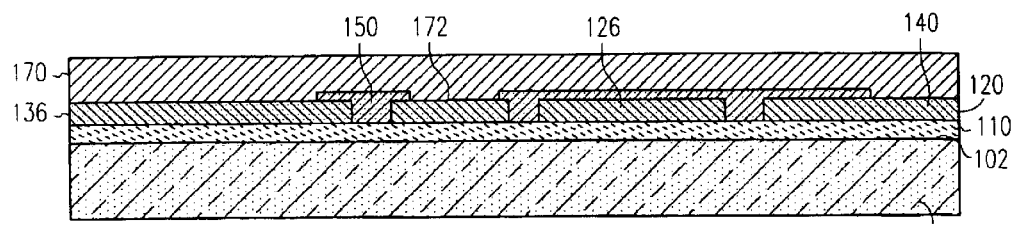

In FIG. 4E, a second polysilicon layer 170 is formed atop the processed release layer 150. In an example embodiment, the thickness of layer 170 can be anywhere from about 1 to 2 microns. Material from layer 170 fills opening 160 to form an anchor 172 connected to beam base 130. Material from layer 170 also fills openings 162 and 164 and connects to upper electrode contacts 136 and 140, respectively.

Figure 4F:
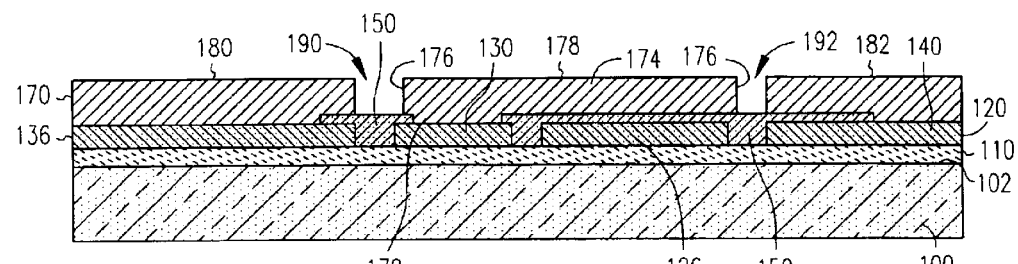

In FIG. 4F, layer 170 is selectively processed (e.g., using standard lithographic techniques) to define a cantilever beam 174 with opposite sides 176 and an upper surface 178. The selective processing of layer 170 also defines upper electrode bases 180 and 182 connected to electrode contacts 136 and 140 and separated from beam 174 by openings 190 and 192. Openings 190 and 192 extend down to release layer 150.

Figure 4G:
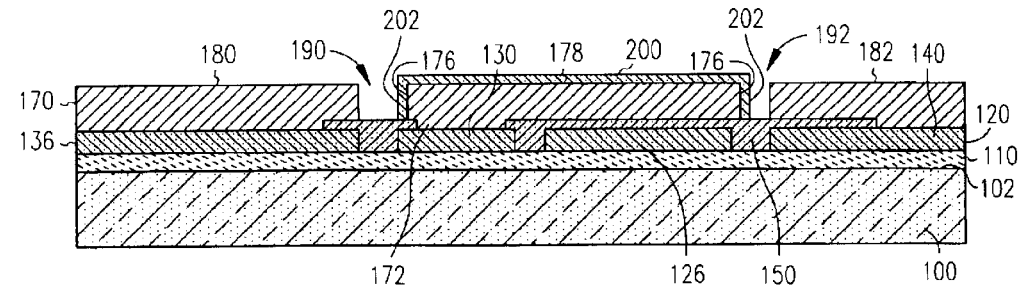

In FIG. 4G, a spacer layer 200 is selectively formed atop upper surface 178 of beam 174 and over sides 176. Spacer layer 200 is used to space apart beam 174 and the yet-to-be-formed upper electrode (FIG. 1). In an example embodiment, spacer layer 200 has a thickness that ranges from about 100 Angstroms to about 5000 Angstroms. Also in an example embodiment, spacer layer 200 is formed from release material such as an oxide (e.g., $SiO_2$) that is selectively grown on the structure by, for example, masking the structure (e.g., with a layer of photoresist), selectively etching the oxide, and then removing the photoresist masking layer. The portion of spacer layer 200 covering sides 176 of beam 174 constitute sidewall spacers 202 that connect with release layer 150.

Figure 4H:
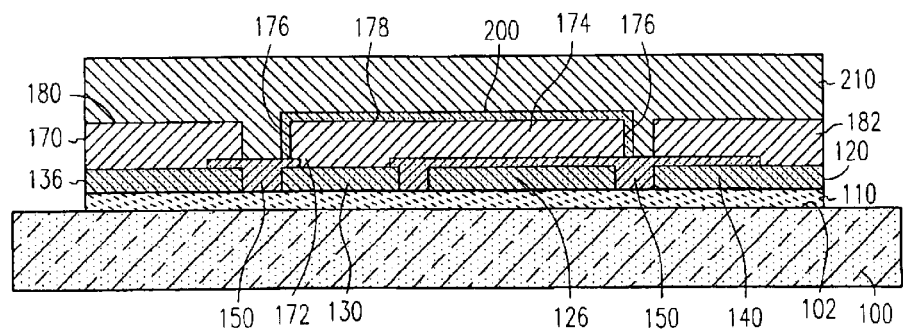

In FIG. 4H, a third polysilicon layer 210 is formed atop electrode bases 180 and 182, and atop spacer layer 200. Layer 210 fills openings 190 and 192 so that the layer also covers sidewalls 202. In an example embodiment, layer 210 has a thickness anywhere from about 1 micron to about 5 microns.

Figure 2:
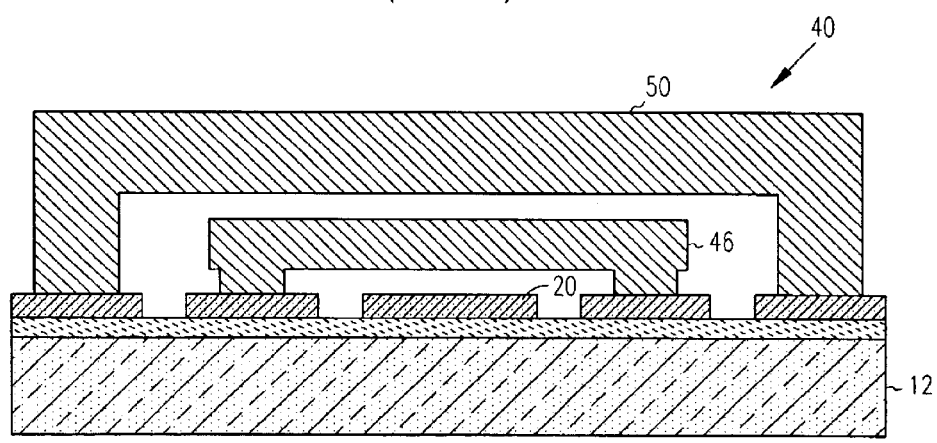
FIG. 2 is schematic cross-sectional diagram of a prior art MEMS resonator with a bridge beam and two activation electrodes.
Figure 4I:
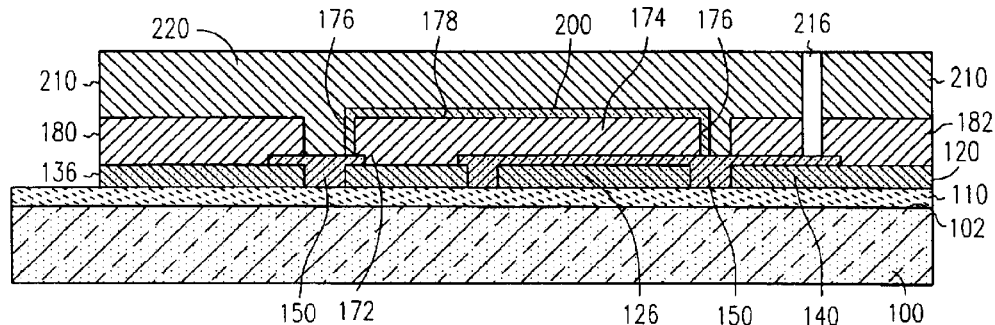

In FIG. 4I, layer 210 is selectively etched to form a release hole 216 that extends through to release layer 150. The selective etching of layer 210 further defines from layer 210 an upper electrode 220, which may be cantilever-type (FIG. 1) or bridge-type (FIG. 2).

Figure 4J:
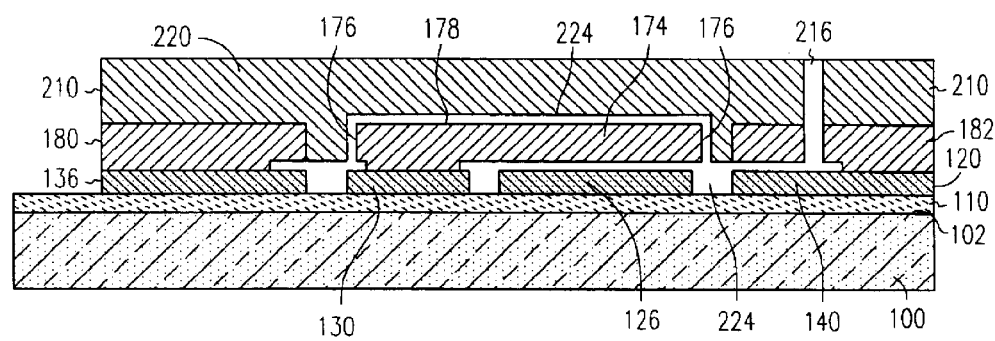

In FIG. 4J, release layer 150 and spacer layer 200 are removed through release hole 216 by etching, dissolving or other techniques suitable to the material of the release layer. This leaves an internal contiguous cavity 224 in the resulting structure, the cavity being defined by first nitride layer 110, lower electrode 126, upper electrode contacts 136 and 140, beam 174, and upper electrode 220. Cavity 224 is open to outside the structure via release hole 216. Beam 174 resides within cavity 224 so that it is free to resonate when electrostatically engaged by lower electrode 126 and upper electrode 220.

Figure 4K:
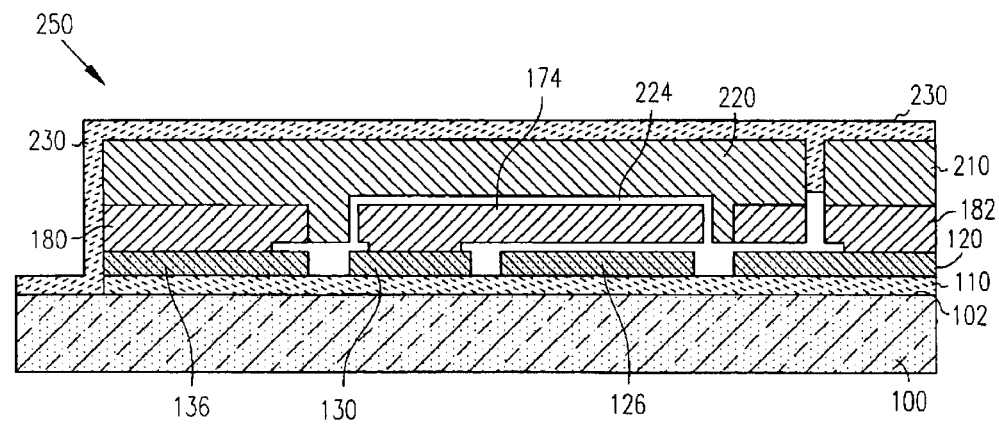

In FIG. 4K, a nitride (e.g., SiN) layer 230 is formed over the structure shown in FIG. 4J. Nitride layer 230 at least partially fills release hole 216, thereby sealing the structure, including cavity 224. The formation of nitride layer 230 is performed under vacuum so that internal cavity 224 is vacuum-sealed. The result is a vacuum-cavity MEMS resonator 250 with a cantilever beam. Note that upper electrode 220 is designed to serve as a support structure to facilitate the vacuum packaging of MEMS resonator 250.

Bridge-beam MEMS resonator (FIGS. 5A–5D)

The method of forming a vacuum-cavity bridge-beam MEMS resonator is similar to the method of forming a cantilever-beam MEMS resonator, as described above. Accordingly, only the essential differences betweeen the two methods are discussed.

Figure 5A:
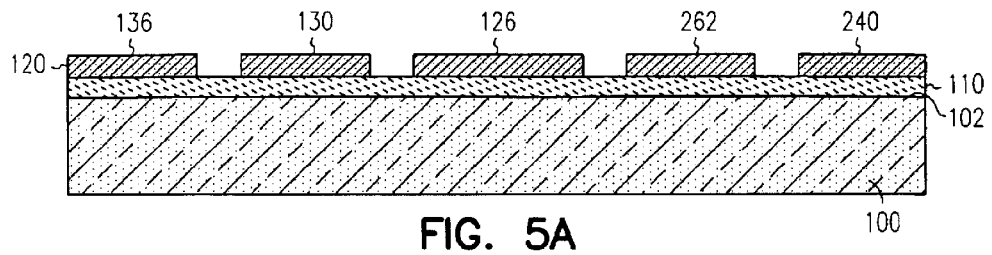
FIGS. 5A, 5B, 5C and 5D illustrate the various structures associated with a method of forming a vacuum-cavity MEMS resonator with a bridge beam.
Figure 5B:
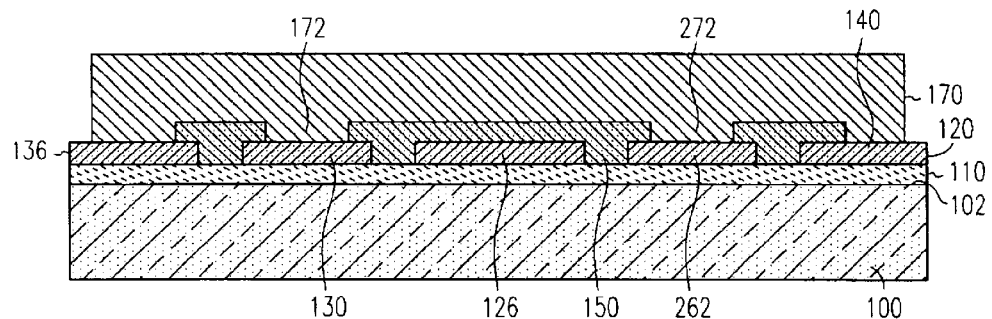

FIG. 5A shows a structure similar to that of FIG. 4B described above, except that an extra beam base 262 is formed atop nitride layer 110 from polysilicon layer 120 between lower electrode 126 and upper electrode contact 140. Also, the structure in FIG. 5B is similar to that formed up through FIG. 4E, except that second polysilicon layer 170 fills an additional opening formed in release layer 150 over beam base 262 that results in the formation of an anchor 272 that connects to beam base 262. Thus, layer 170 is connected to nitride layer 110 via bases 130 and 262 located on opposite sides of lower electrode 126.

Figure 5C:
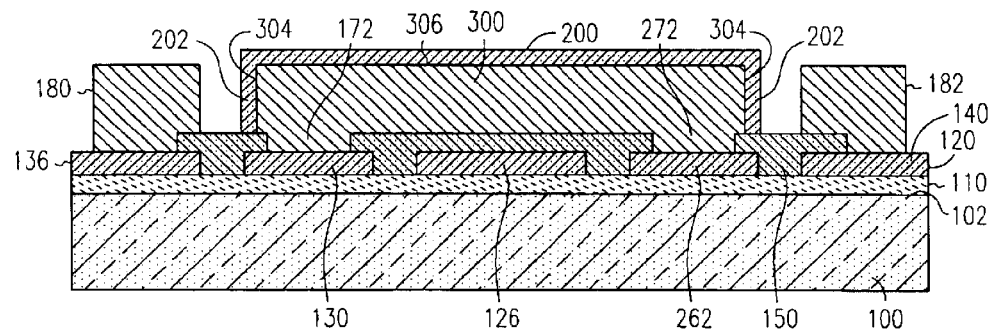

Further, the structure of FIG. 5C is similar to that formed up through FIG. 4G, except that instead of cantilever beam 174, there is a bridge beam 300 with opposite sides 304 and an upper surface 306. Spacer layer 200 with sidewalls 202 is formed on beam 300 (including over sides 304) in the manner described above in connection with FIG. 4G, and is connected to release layer 150.

Figure 5D:
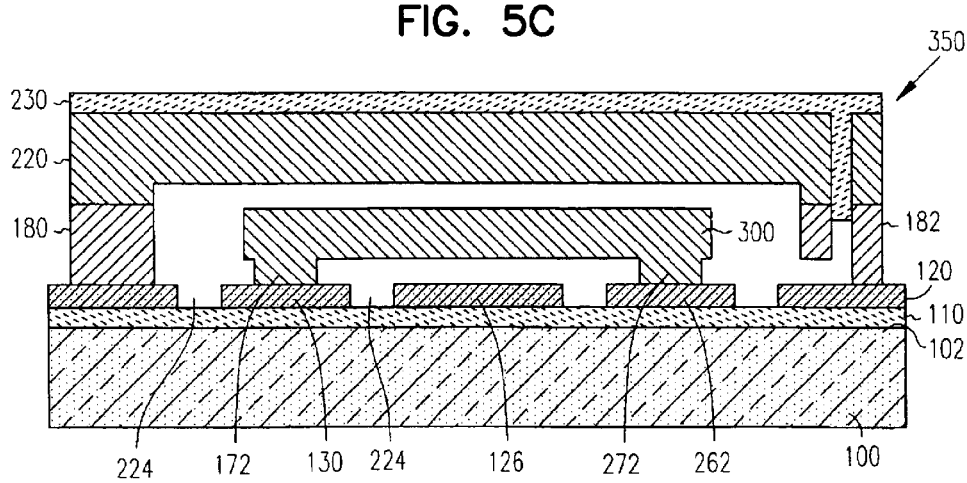

The resulting vacuum-cavity bridge-beam MEMS resonator 350 is shown in FIG. 5D. Internal cavity 224 is contiguous because beam 300 does not contact upper electrode bases 180 or 182 or other structural elements in the MEMS resonator in the direction out of the plane of the FIG. 5D. Thus, beam 300 resides within cavity 224 so that it is free to resonate when electrostatically engaged by lower and upper electrodes 126 and 220.

As with MEMS resonator 250, upper electrode 220 of MEMS resonator 350 is designed to serve as a support structure to facilitate vacuum packaging. MEMS resonator 350 can have a cantilever-type upper electrode or bridge type upper electrode (FIGS. 1 and 2; FIG. 4K).

Breathing-beam MEMS resonator (FIGS. 6A–6K)

Figure 6A:
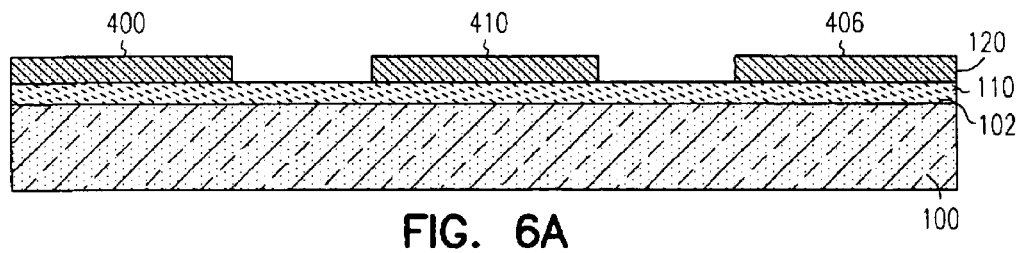
FIGS. 6A, 6B, 6C, 6D, 6E, 6F, 6G, 6H, 6I, 6J and 6K illustrate the various structures associated with a first method of forming a vacuum-cavity MEMS resonator with a breathing-bar beam.

The method begins as described above in connection with FIGS. 4A and 4B. However, as illustrated in FIG. 6A, two electrode bases 400 and 406 and a beam base 410 are formed from layer 120. In an example embodiment, electrode bases 400 and 406 are connected to bond pads (not shown), which in turn are connected to a programmable voltage source (not shown) for providing power to the device. Beam base 410 may be connected to ground.

Figure 6B:
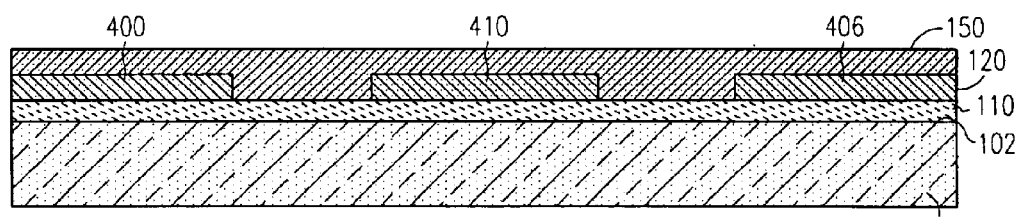

In FIG. 6B, release layer 150 is formed over electrode bases 400 and 406, beam base 410 and the exposed or uncovered portions of nitride layer 110. Planarizing of layer 150 (e.g., using CMP) to ensure the layer has the required thickness (e.g., a few hundred to a few thousand Angstroms) may optionally be performed.

Figure 6C:
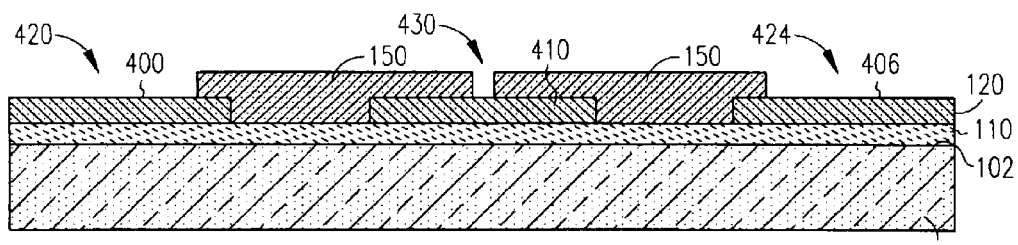

In FIG. 6C, release layer 150 is selectively processed to define openings 420 and 424 that extend down to electrode bases 400 and 406. Also formed in release layer 150 is an opening 430 that extends down to beam base 410.

Figure 6D:
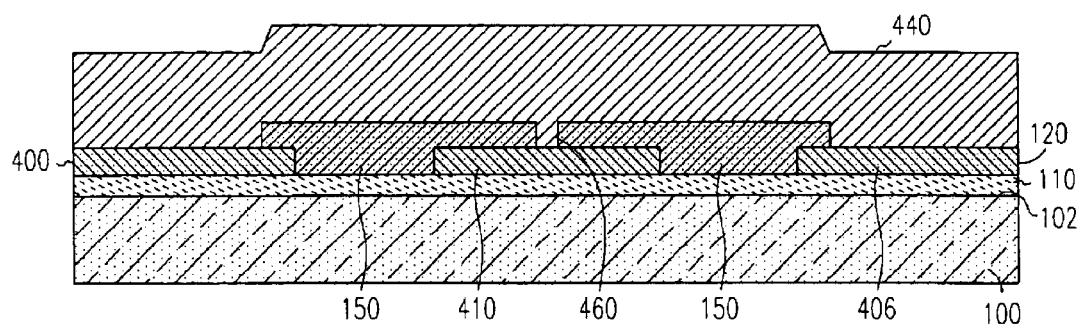

In FIG. 6D, a second polysilicon layer 440 is formed (e.g., conformally deposited) over release layer 150. A portion of layer 440 fills openings 420 and 424 down to electrode bases 400 and 406. Further, a portion of layer 440 fills opening 430, forming a beam support member 460 fixed to beam base 410.

Figure 6E:
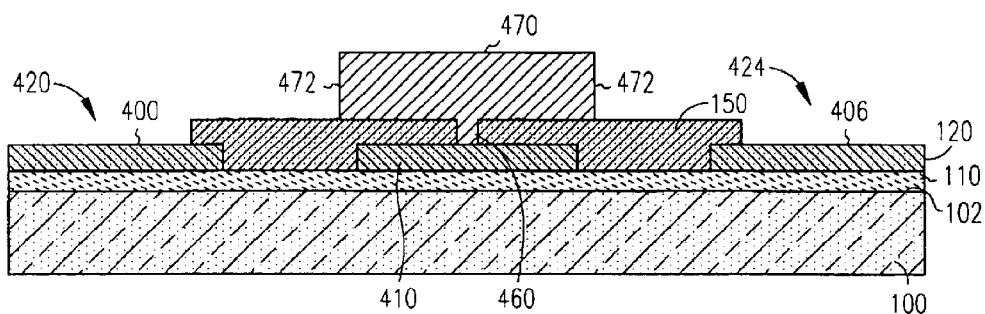

In FIG. 6E, layer 440 is selectively processed to define a center beam 470 with opposite sides 472. Center beam 470 is supported by beam support member 460 as well as by the portion of release layer 150 between the beam and beam base 410. Also, the selective processing may optionally include adjusting the thickness of electrode bases 400 and 406.

Figure 3:
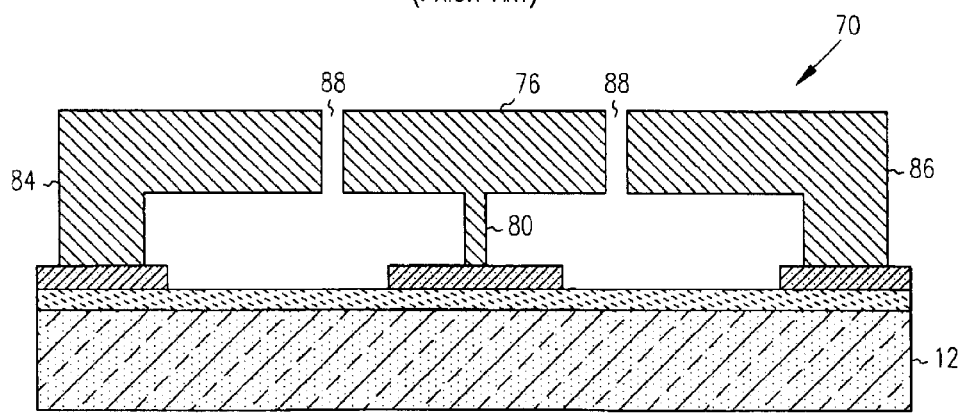
FIG. 3 is a schematic cross-sectional diagram of a prior art MEMS resonator with a "breathing bar" beam that includes a single central beam surrounded on two sides by side actuation electrodes.
Figure 6F:
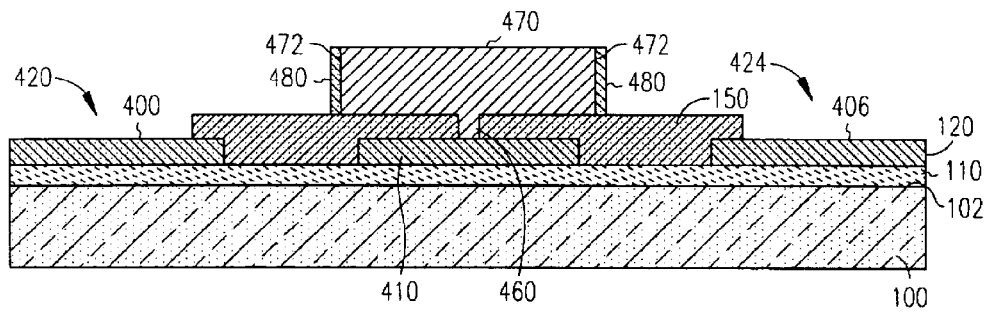

In FIG. 6F, sidewall spacers 480 made of a release material (e.g., an oxide) are formed over sides 472 of beam 470, e.g., as described above in connection with FIG. 4G. Sidewall spacers 480 serve to space apart the yet-to-be-formed side electrodes from the beam (FIG. 3).

Figure 6G:
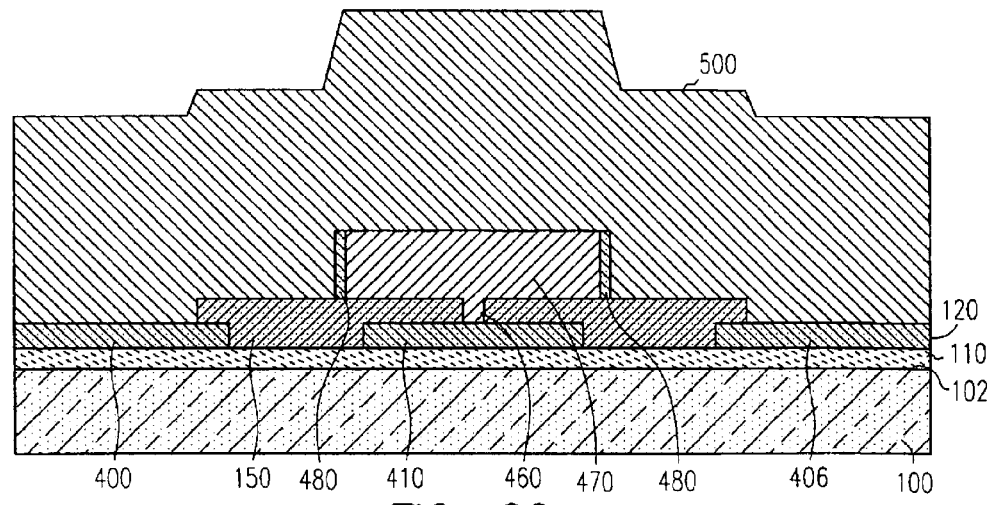

In FIG. 6G, a relatively thick (e.g., 2 to 3 microns) polysilicon layer 500 is then formed (e.g., conformally deposited) atop the structure of FIG. 6F, with polysilicon filling openings 420 and 424 and covering sidewall spacers 480.

Figure 6H:
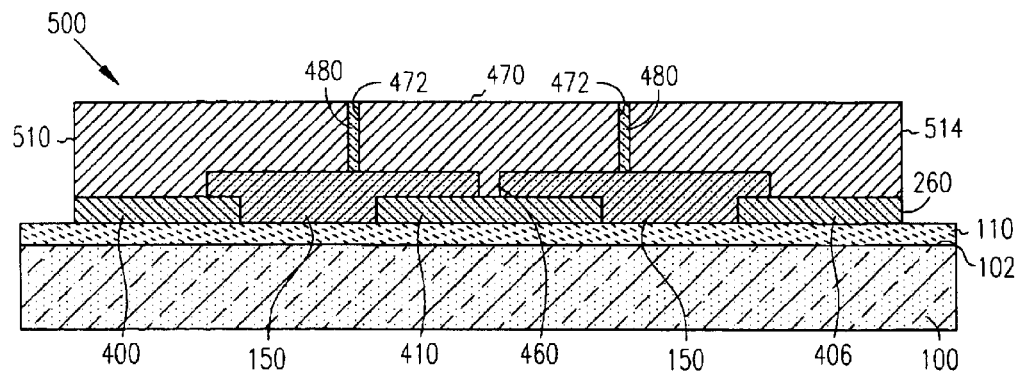

In FIG. 6H, the structure of FIG. 6G is planarized (e.g., via CMP) down to at least sidewalls 480 in order to form side electrodes 510 and 514, which are connected to respective electrode bases 400 and 406 and spaced apart from sides 472 of beam 470 by sidewall spacers 480. At this point in the process, various interconnections (e.g., bond pads, electrical connections to the electrodes, etc.) for powering the MEMS resonator and connecting the MEMS resonator to other devices can be formed using standard lithographic techniques.

Figure 6I:
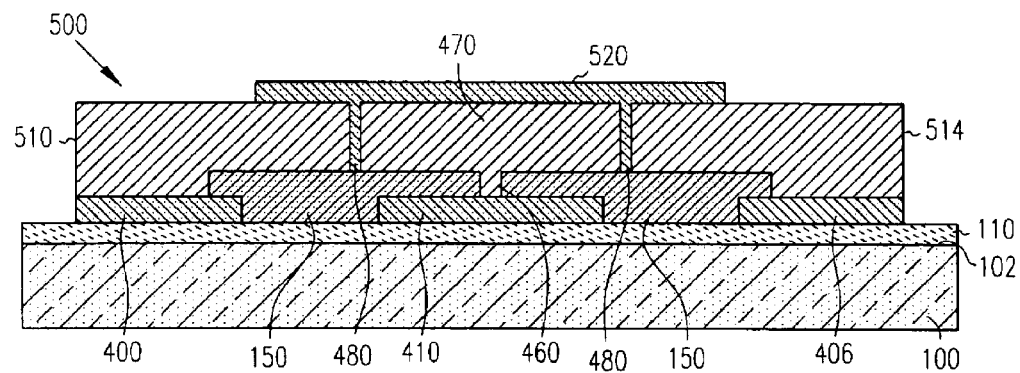

In FIG. 6I, another release layer 520 is selectively formed atop beam 470, sidewall spacers 480, and a portion of side electrodes 510 and 514, in a manner similar to that discussed in connection with FIGS. 4C and 4D.

Figure 6J:
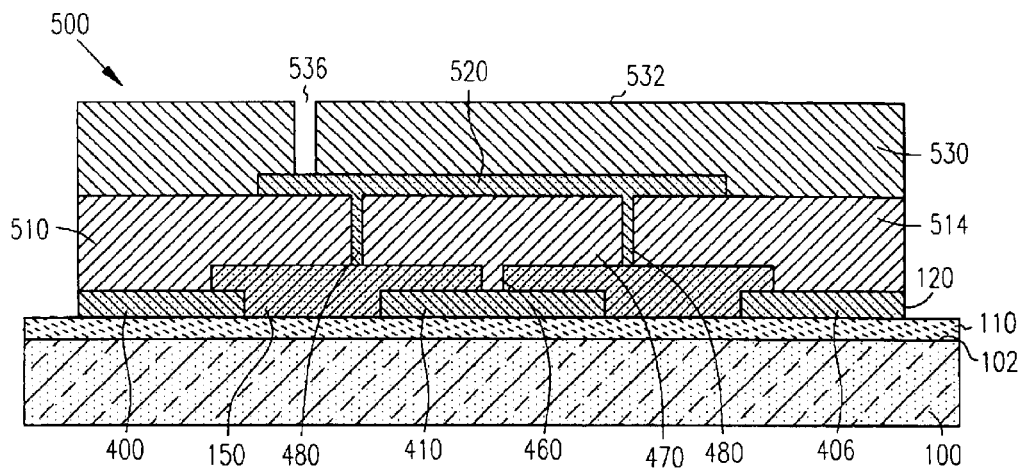

In FIG. 6J, a polysilicon layer 530 with an upper surface 532 is then formed over release layer 520 and is planarized, if necessary. A release hole 536 is then formed in polysilicon layer 530 that connects upper surface 532 to release layer 520. Polysilicon layer 530 provides the structural support for isolating beam 470 and for vacuum-packaging the MEMS resonator.

Figure 6K:
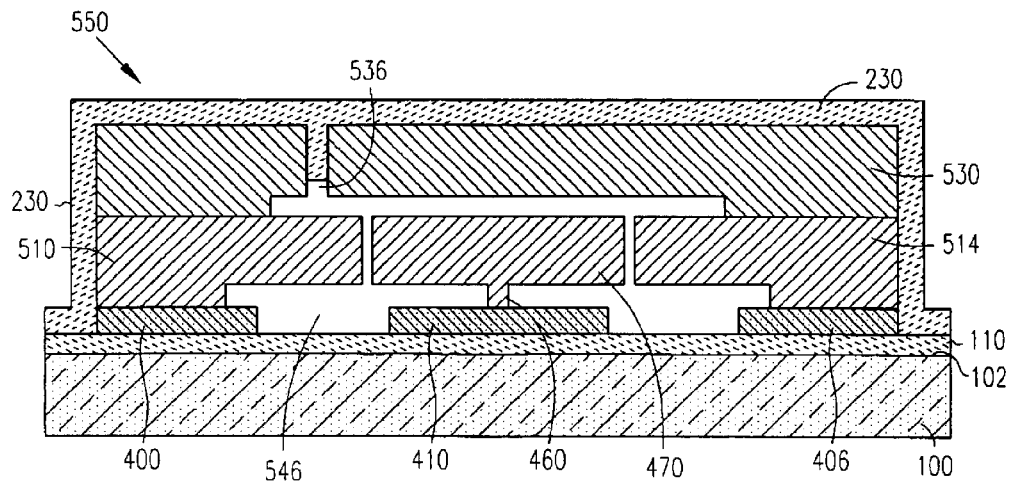

In FIG. 6K, the release material making up layers 150 and 520 and sidewall spacers 480 are removed through release hole 536. When the removal process is complete, an internal cavity 546 is formed within the resulting structure that includes release hole 536. Then, as discussed above in connection with FIG. 4K, nitride (e.g., SiN) layer 230 is deposited over the structure, with some of the nitride at least partially filing release hole 536. The result is the formation of a MEMS resonator 550 having a vacuum-sealed cavity 546 in which resides "breathing beam" 470 located between side electrodes 510 and 514 that electrostatically engage the beam.

Breathing-beam MEMS resonator—alternative method (FIGS. 7A–7E)

An alternative method of forming a vacuum-cavity breathing-beam MEMS resonator is now described with reference to FIGS. 7A through 7E. The alternative method adds a step of forming a release layer to the first method, but also eliminates a CMP planarization step.

Figure 7A:
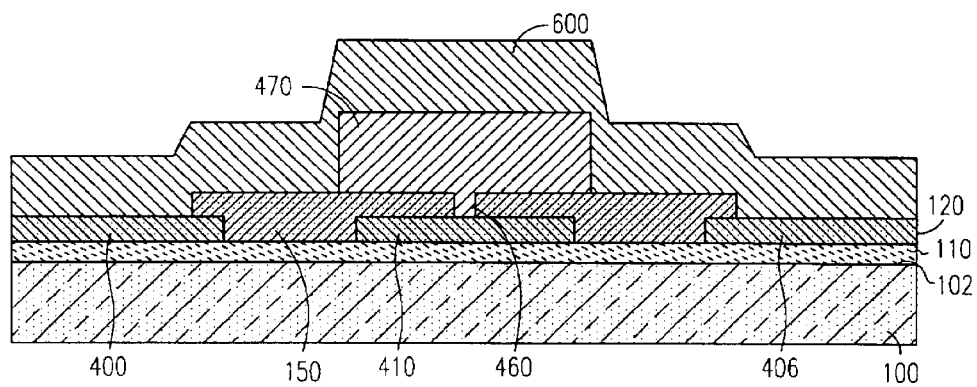
FIGS. 7A, 7B, 7C, 7D and 7E illustrate the various structures associated with a second method of forming a vacuum-cavity MEMS resonator with a breathing-bar beam.
Figure 7B:
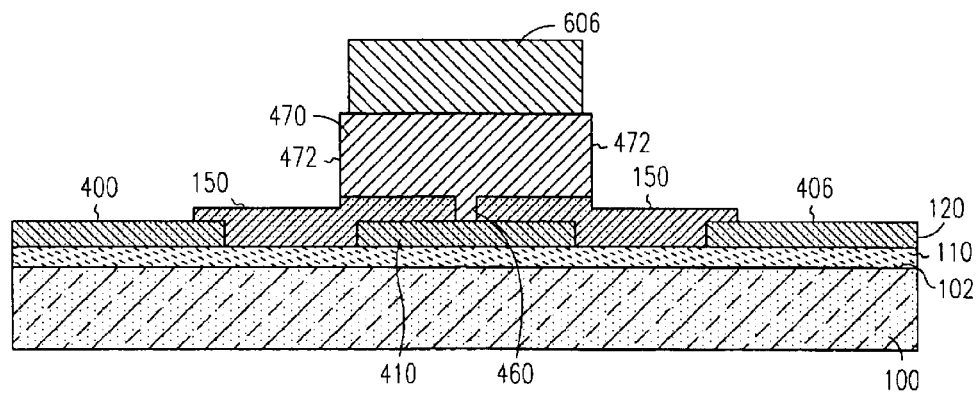

With reference to FIG. 7A, the alternative method begins with the structure of FIG. 6E described above, and further includes forming (e.g., conformally depositing) a second release layer 600 atop the structure of FIG. 6E. Then, in FIG. 7B, release layer 600 is selectively processed (e.g., using standard lithographic techniques) to leave an island 606 of release layer material atop beam 470.

Figure 7C:
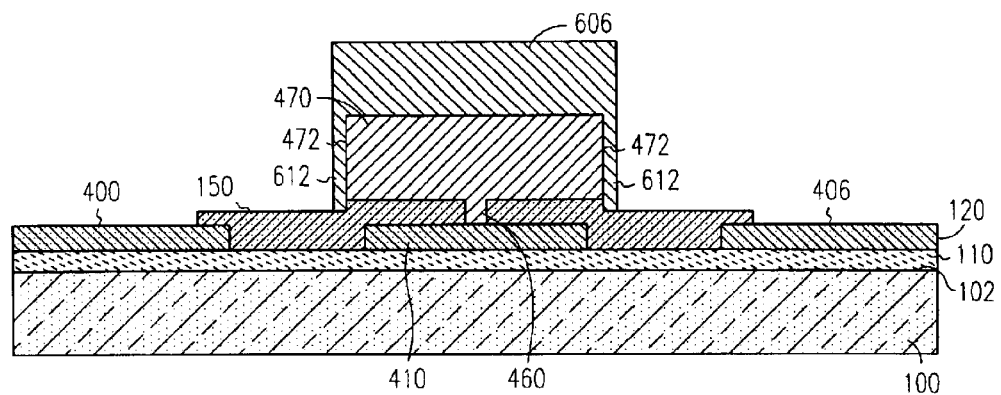

In FIG. 7C, sidewall spacers 612 made of release material (e.g., oxide) are formed over sides 472 of beam 470, e.g., in the manner described above in connection with FIG. 4G.

Figure 7D:
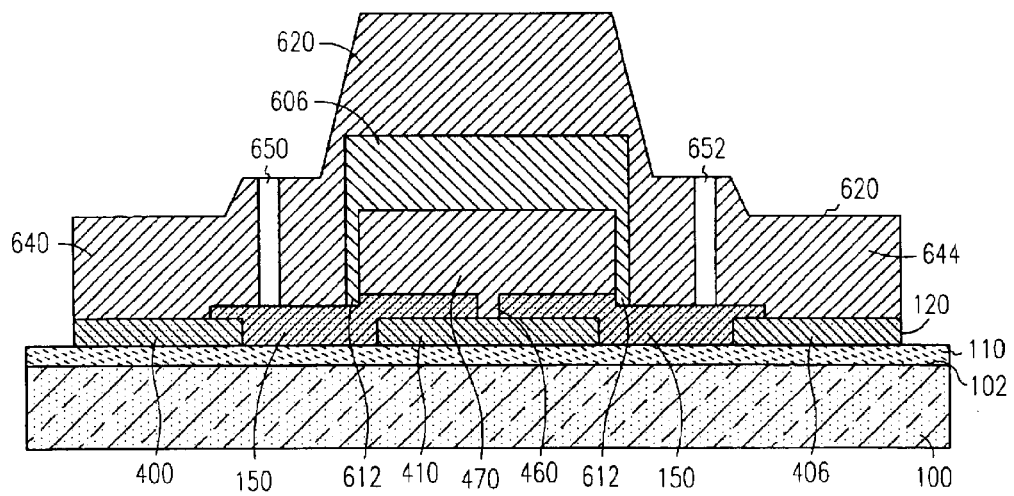

In FIG. 7D, a polysilicon layer 620 is then formed (e.g., conformally deposited) atop the entire structure of FIG. 7C, thereby defining side electrodes 640 and 644, which extend down to and are fixed to respective electrode bases 400 and 406. Release holes 650 and 652 are then formed in polysilicon layer 620 down to release layer 150.

Figure 7E:
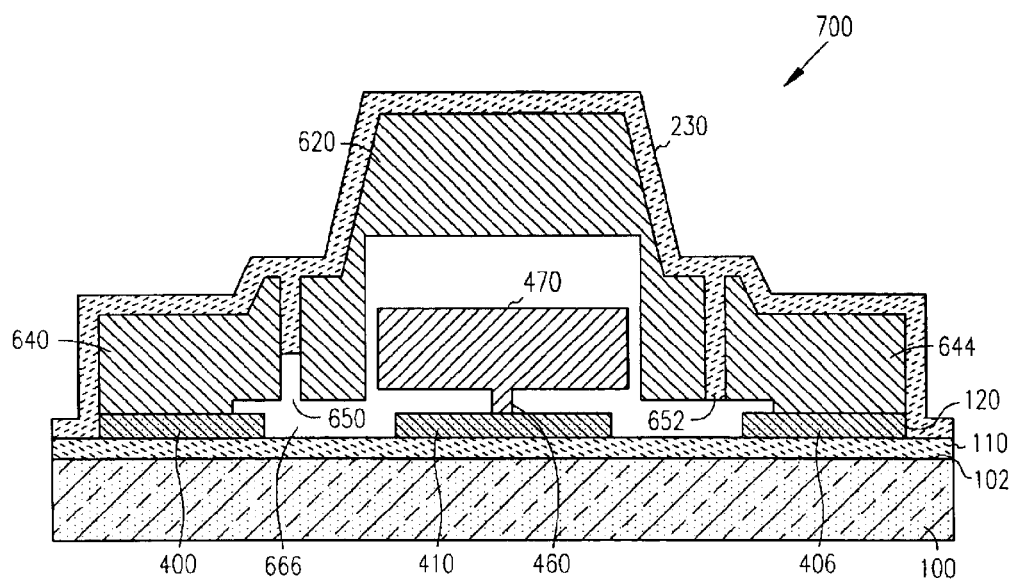

In FIG. 7E, the release material making up release layer 150, sidewalls 612 and island 606 is removed from the structure through release holes 650 and 652, thereby forming an internal cavity 666 within the structure. As discussed above in connection with FIGS. 4K and 6K, nitride layer 230 is then deposited under vacuum over the structure, with some of the material from the layer at least partially filling release holes 650 and 652. The result is a vacuum-cavity breathing-beam MEMS resonator 700 having a vacuum cavity 666 in which resides central "breathing" beam 470 between side electrodes 640 and 644.

MEMS resonator circuit

Figure 8:
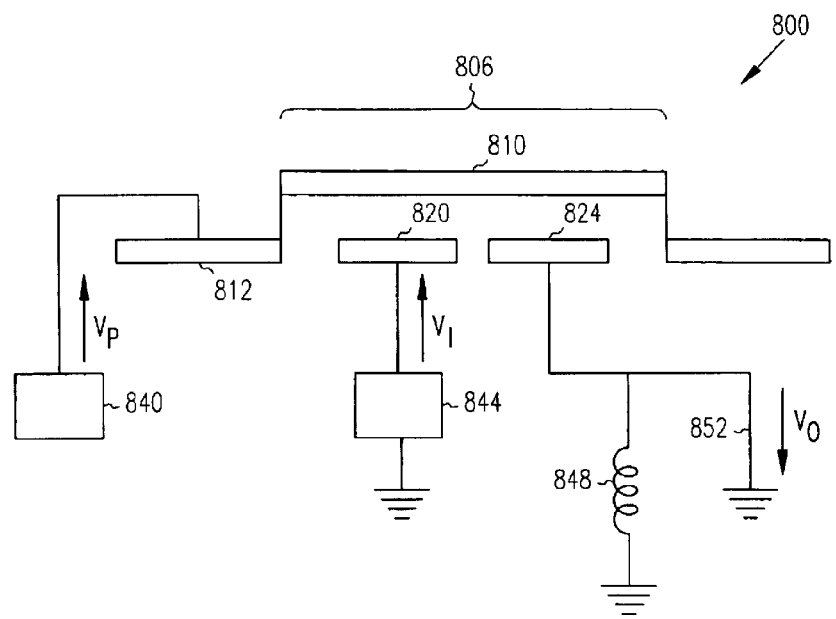
FIG. 8 is a schematic resonator circuit diagram that includes a MEMS resonator of the present invention.

With reference to FIG. 8, there is shown a MEMS resonator circuit 800 that includes a vacuum-cavity MEMS resonator 806 according to the present invention. For example, MEMS resonator 806 can be the vacuum-cavity cantilever beam MEMS resonator 250 (FIG. 4K), the vacuum-cavity bridge-beam MEMS resonator 350 (FIG. 5D), the vacuum-cavity breathing-beam MEMS resonator 550 (FIG. 6K) or the vacuum-cavity breathing-beam MEMS resonator 700 (FIG. 7E).

MEMS resonator 806 includes a beam 810 with a beam contact 812 (e.g., an extension of beam base 130 of FIG. 4K), and first and second electrodes 820 and 824 (e.g., lower electrode 126 and upper electrode 220 of MEMS resonator 250 or side electrodes 510 and 514 of MEMS resonator 550). Beam 810 may be biased with a DC polarization voltage $V_P$ from voltage source 840. First electrode 820 may be connected to an input voltage source 844 providing an input voltage $V_I$. Input voltage source 844 may comprise, for example, an antenna. An inductor 848 and a voltage output line 852 for measuring an output voltage $V_O$ may be connected in parallel to second electrode 824.

In an example embodiment, beam 810 has a resonant frequency ranging anywhere from a fraction of a megahertz to hundreds of megahertz to a few gigahertz, and a Q-factor ranging anywhere from a thousand to several tens of thousands (generally, the lower the resonant frequency, the higher the Q-factor).

If the frequency of the input voltage $V_I$ is not close to the resonant frequency of beam 810, then there is no output voltage $V_O$ from second electrode 824. When the frequency of the input voltage $V_I$ is at or near the resonant frequency of beam 810, the beam starts to resonate (how close the input voltage $V_I$ must be to the resonant frequency is determined by the Q-factor). This causes a capacitance change with respect to electrode 824, which causes an AC current $I=(V_P)dC/dT$ to pass through inductor 848 at or near the resonant frequency of the beam, thus providing a mechanism for filtering an input voltage.

Conclusion

The present invention includes several different types of MEMS resonators that have vacuum cavities, and methods of forming same. In each MEMS resonator, the vacuum cavity surrounds the beam, allowing the MEMS resonators to maintain a high resonant frequency by eliminating air-damping of the oscillation. The vacuum cavity also prevents adhesion of contaminants to the beam, which can alter the beam's resonant frequency.

Further, the upper electrode is designed to serve as a support structure for vacuum packaging, which keeps the number of process steps reasonable from a manufacturing viewpoint. Also, the methods disclosed can utilize standard lithography techniques, which further limits the need for specialized process steps.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A method of forming a vacuum-cavity microelectromechanical (MEMS) resonator, comprising:
    forming a first beam base atop a first passivation layer covering a surface of a substrate;
    forming a beam fixed to the first beam base, the beam supported by a first layer of release material;
    forming first and second electrodes adjacent the beam but spaced apart therefrom by a second layer of release material connected to the first layer of release material;
    removing the first and second layers of release material to form a cavity in which the beam resides; and
    vacuum-sealing the cavity.

2. The method of claim 1, wherein the release material comprises silicon dioxide.

3. The method of claim 1, wherein the passivation layer comprises nitride.

4. The method of claim 1, wherein the first electrode is formed adjacent a lower surface of the beam, and the second electrode is formed adjacent an upper surface of the beam.

5. The method of claim 4, wherein vacuum-sealing the cavity includes forming under vacuum a nitride layer over the second electrode.

6. The method of claim 4, including fixing the beam to the first beam base at a first beam end to form a cantilever beam.

7. The method of claim 4, including forming a second beam base atop the passivation layer and fixing the beam to the second beam base at a second beam end to form a bridge beam.

8. The method of claim 4, wherein removing the first and second release layers includes forming a release hole in the second electrode.

9. The method of claim 1, including forming first and second sidewall spacers of release material on first and second sides of the beam, and forming the first and second electrodes adjacent the first and sidewall spacers.

10. The method of claim 9, including forming a polysilicon layer atop the second release layer to serve as a support structure for the MEMS resonator.

11. The method according to claim 10, wherein removing the release material includes forming a release hole in the polysilicon layer down to the second layer of release material.

12. A method of forming a vacuum-cavity microelectromechanical (MEMS) resonator, comprising:
    forming a first electrode, a first beam base and a first second-electrode contact atop a passivation layer covering the surface of a substrate;
    forming a beam fixed to the first beam base at a first end of the beam, the beam spaced apart from the first electrode by a first release layer;
    forming a second electrode connected to the first second-electrode contact at a first end of the second electrode, including spacing apart the second electrode from the beam by a second release layer in contact with the first release layer;
    removing the first and second release layers to form a cavity in which the beam resides; and
    vacuum-sealing the cavity.

13. The method according to claim 12, further including forming a second second-electrode contact atop the passivation layer and fixing a second end of the second electrode to the second second-electrode contact to form a bridge-type second electrode.

14. The method according to claim 13, further including forming a second beam base atop the passivation layer and fixing a second end of the beam to the second beam base to form a bridge-type beam.

15. The method according to claim 12, including forming the passivation layer from nitride.

16. A method of forming a microelectromechanical (MEMS) resonator, comprising:
    forming a resonating beam separated from two electrodes by one or more release layers;
    removing the one or more release layers to form a cavity; and
    vacuum sealing the cavity.

17. The method of claim 16, wherein the removing of the one or more release layers comprises allowing an etchant access to the one or more release layers via one or more through-holes.

18. The method of claim 17, wherein vacuum sealing the cavity comprises depositing a polysilicon layer over the one or more through-holes.

19. A method of forming a vacuum-cavity microelectromechanical (MEMS) resonator, comprising:
    forming a beam atop a passivation layer, the beam having first and second opposite sides with respective sidewall spacers of release material formed thereon, the beam connected to the passivation layer by a central support member and a first release layer;
    forming first and second electrodes arranged adjacent the first and second opposite sides of the beam and spaced apart therefrom by the sidewall spacers;

forming a polysilicon layer atop the beam and the first and second electrodes, including spacing apart the polysilicon layer from the beam with a second release layer;

removing the first and second release layers and the sidewall spacers to form a contiguous cavity in which the beam resides; and vacuum-sealing the contiguous cavity.

20. The method of claim 19, wherein the first and second electrode and beam comprise polysilicon.

21. The method of claim 19, including forming first and second electrode bases atop the passivation layer, and forming the first and second electrodes so as to be connected to the first and second electrode bases, respectively.

22. The method of claim 19, including forming a beam base atop the passivation layer and forming the central support member so as to be fixed to the beam base.

23. The method of claim 19, wherein vacuum-sealing the contiguous cavity includes forming a nitride layer atop the polysilicon layer.

24. The method of claim 19, wherein forming the polysilicon layer spaced apart from the beam by the second release layer includes:

depositing polysilicon atop the beam, the first release layer, and first and second electrode bases;

planarizing the polysilicon down to the sidewall spacers and the beam;

selectively depositing the second release layer atop the beam and atop portions of the planarized polysilicon on either side of the beam; and depositing polysilicon atop the second release layer.

25. The method of claim 19, wherein forming the polysilicon layer spaced apart from the beam by the second release layer includes:

depositing release material atop the beam, the first release layer, and first and second electrode bases;

selectively etching the release material to form an island of release material atop the beam;

forming the sidewall spacers by growing a layer of release material on the sides of the beam; and depositing polysilicon atop the island of release material, the sidewall spacers, the first layer of release material, and the first and second electrode contacts.

* * * * *